United States Patent [19]
Miyoshi

[11] 4,447,133
[45] May 8, 1984

[54] ELECTROCHROMIC DEVICE

[75] Inventor: Taisuke Miyoshi, Tokyo, Japan

[73] Assignee: Seiko Instruments & Electronics Ltd., Tokyo, Japan

[21] Appl. No.: 257,873

[22] Filed: Apr. 27, 1981

[51] Int. Cl.³ .............................................. G02F 1/17
[52] U.S. Cl. .................................................. 350/357
[58] Field of Search ...................................... 350/357

[56] References Cited

U.S. PATENT DOCUMENTS 4,346,964  8/1982  Ishihama et al. ..................... 350/357
4,390,246  6/1983  Miyoshi ............................... 350/357

FOREIGN PATENT DOCUMENTS 43575  3/1980  Japan ..................................... 350/357

*Primary Examiner*—James W. Davie
*Attorney, Agent, or Firm*—Robert E. Burns; Emmanuel J. Lobato; Bruce L. Adams

[57] ABSTRACT

An electrochromic device includes a layer of electrochromic material, such as tungsten oxide, which is deposited by oblique evaporation at an acute angle of incidence in the range of from 30° to 70° between the normal to the substrate and the direction of the evaporation. Due to the anisotropic topography achieved by the oblique evaporation, the layer of electrochromic material exhibits improved fast response time and long life time of cycling of coloration and bleaching.

16 Claims, 13 Drawing Figures

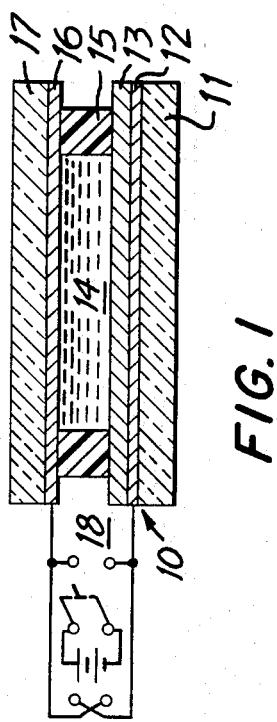
FIG. I
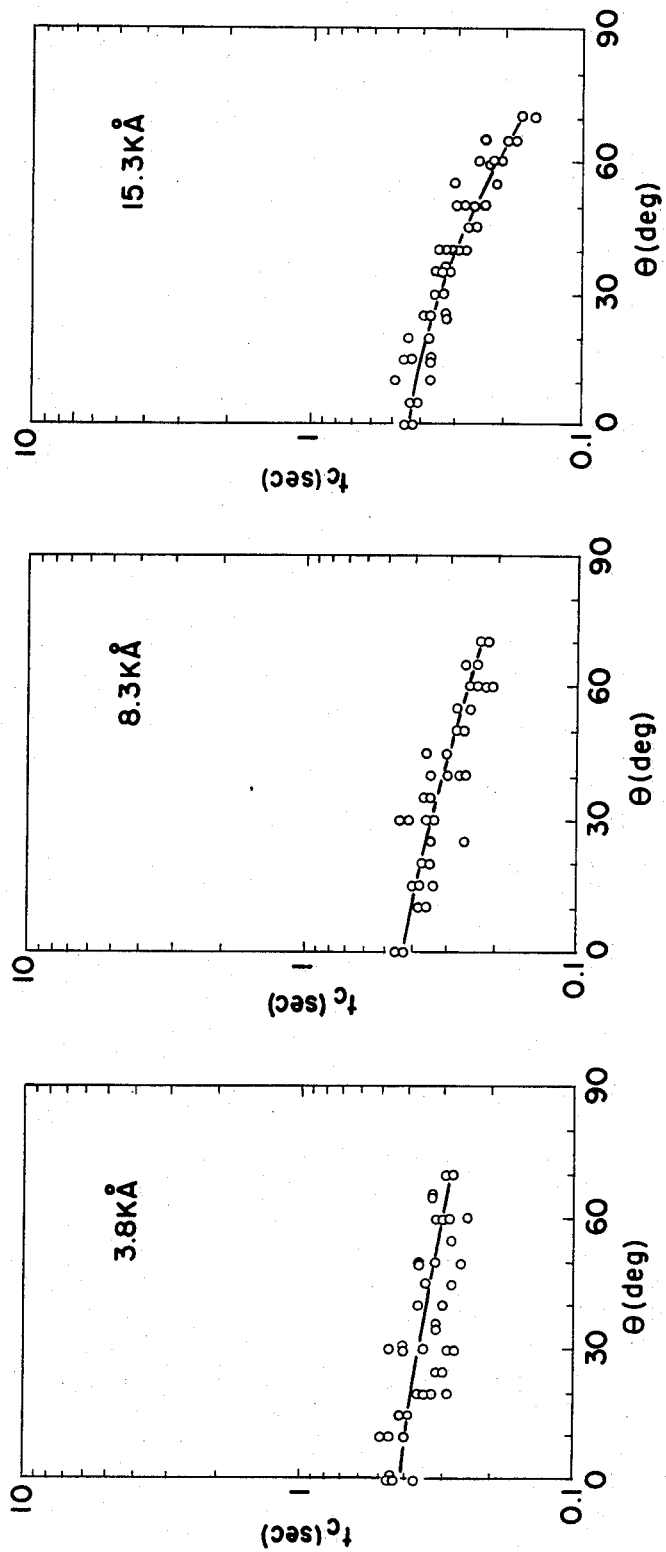
FIG. 4
FIG. 3
FIG. 2

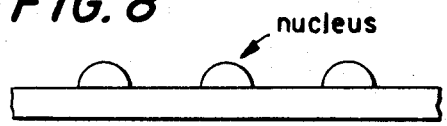
FIG. 8
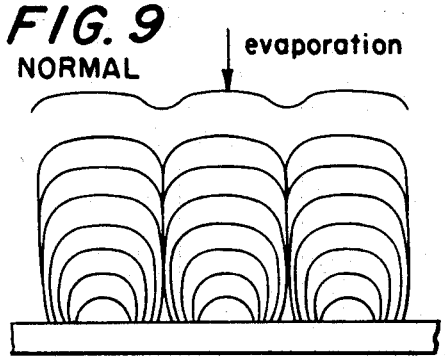
FIG. 9 NORMAL
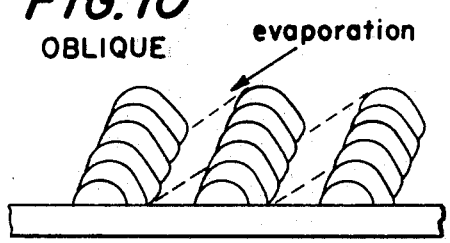
FIG. 10 OBLIQUE
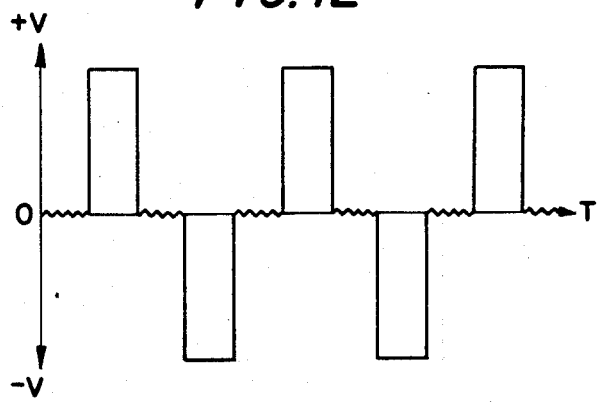
FIG. 12
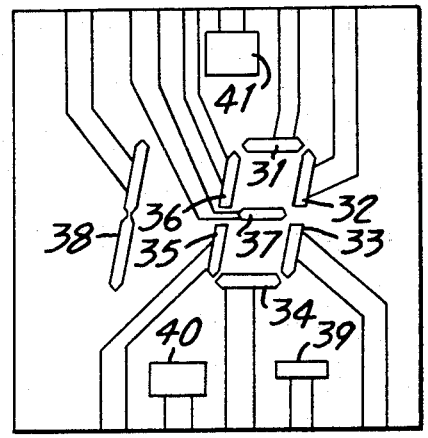
FIG. 13
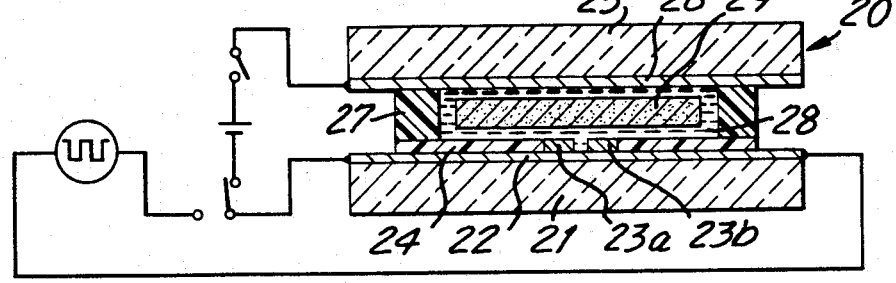
FIG. 11

ELECTROCHROMIC DEVICE

BACKGROUND OF THE INVENTION

This invention relates generally to an electrochromic display device, and more particularly to an electrochromic display device in which the electrochromic layer is deposited by a technique known as oblique evaporation.

Electrochromic devices are well-known devices which exhibit a phenomenon known as "persistent electrochromism", e.g. see U.S. Pat. No. 3,521,941 entitled, "Electro-Optical Device Having Variable Optical Density", issued July 28, 1970. The term "persistent electrochromism" denotes the property of a material whereby its electromagnetic radiation absorption characteristic is altered, in most instances, even at ambient temperature, under the influence of an electric field.

Such materials, for example, may exhibit little or no absorption of visible wavelength in the absence of an electric field and therefore be transparent, but when subjected to an electric field, effectively absorb in the red end of the electromagnetic spectrum, turning blue in color. Similar effects can be observed in other portions of the electromagnetic spectrum, invisible as well as visible.

There have been numerous studies of the electrochromic process which occurs at the electrochromic electrode. Various attempts to utilize the electrochromic devices, such as in numerical displays, have been made, but most attempts have been discouraged by defects of the electrochromic devices, e.g. slow coloring and bleaching response, and short cycle lifetime of coloring and bleaching.

SUMMARY OF THE INVENTION

It is therefore an object of this invention to provide an electrochromic device which has a fast response and a long life time of cycling of coloration and bleaching.

These and other objects of the invention will become apparent as the description thereof proceeds.

BRIEF DESCRIPTION OF THE DRAWING

FIG. 1 is a cross-sectional schematic view of an embodiment of electrochromic display device according to the present invention.

FIGS. 2-4 are graphs showing coloring response time $t_c$ vs the angle of incidence $\theta$.

FIGS. 8-10 are illustrations of thin film growth deposited by evaporation.

FIG. 11 is a cross-sectional schematic view of another embodiment of electrochromic display device according to the present invention.

FIG. 12 is a graph showing electric field applied between the $WO_3$ electrodes.

FIG. 13 is a plan view showing an embodiment of the numerical display according to the present invention.

DETAILED DESCRIPTION OF THE INVENTION

Figure 7:
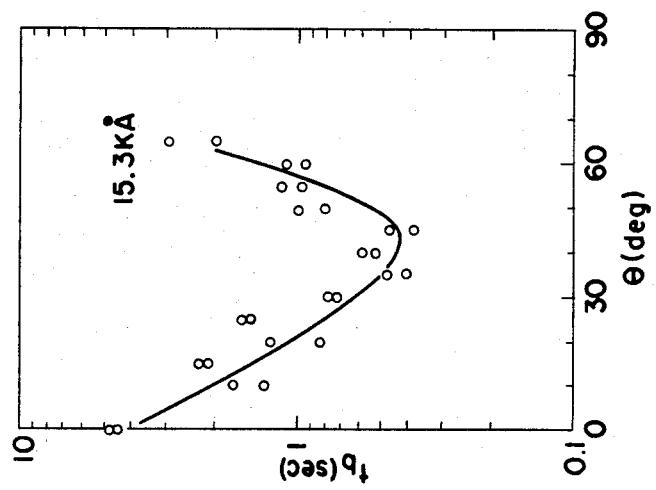
FIGS. 5-7 are graphs showing bleaching response time $t_b$ vs the angle of incidence $\theta$.

Referring initially to FIG. 1, an electrochromic display device of the present invention is generally designated by reference numeral 10. The device includes a transparent substrate 11, e.g., glass or plastics, and a first transparent electrode 12, e.g., tin-doped indium oxide or antimony-doped tin oxide, on the substrate 11. An electrochromic layer 13, e.g., $WO_3$, $MoO_3$ or $V_2O_5$, is deposited in a predetermined pattern on the first electrode 12.

In accordance with the present invention, the electrochromic layer 13 is deposited by an oblique evaporation technique.

An electrolyte 14, such as sulfuric acid, lithium perchlorate in propylene carbonate, lithium nitride, $CaF_2$, $MgF_2$ or $Na_{1+x}Zr_2Si_xP_{3-x}O_{12}$, is disposed in contact with a surface of the electrochromic layer 13 and contains therein a white background material, e.g., $TiO_2$ pigment.

The electrolyte 14 is partially contained by a spacer 15. It is preferable that the spacer 15 be of a material which is inert with respect to the electrochromic environment of the device 10, e.g., a plastics. A second electrode 16 is disposed in contact with the electrolyte 14 such that the electrolyte 14 is completely contained within the space defined by the electrochromic layer 13, the spacer 15 and the second electrode 16. The second electrode 16 may comprise gold film deposited on a substrate 17, e.g., glass or ceramics.

A conventional electrical biasing network 18 is provided to enable one to selectively reverse the electrical biasing such that one polarity will produce coloration of the electrochromic layer 13 which will remain in the colored state even after the removal of the biasing, while the opposite polarity will cause bleaching, as is well known in the art.

The coloring mechanism of the electrochromic material is not throughly understood but when the electrochromic material is $WO_3$, the coloring process is believed to occur with the simultaneous injection of electrons and positive ions into colorless $WO_3$, forming a so-called "tungsten bronze" according to the following reaction

$$xM^+ + xe^- + WO_3 \rightleftarrows M_x{}^+WO_3e_x{}^-$$

where $M^+$ is a positive ion, and x is a numerical value more than 0 and less than 1.

Coloring and bleaching responses are measured as follows: Reflectance of the electrochromic layer decreases as the electric charge is injected into it. The reflectance of the light from a halogen lamp is measured by a photomultiplier through a filter designed so as to correspond to a visibility curve.

Response time denotes the time required for the reflectance change of the electrochromic layer, and generally the response time refers to the time required for the reflectance to decrease to 45% from the colorless state during the coloring process and to increase to 90% from 45% during the bleaching process. 100% means the fully bleached colorless state.

The electrochromic device of FIG. 1 can be constructed by methods well known in the art. The electrochromic layer 13 according to the present invention is a $WO_3$ layer deposited by oblique evaporation. In contrast, the conventional electrochromic layers are deposited by evaporation at normal incidence.

The response times of coloring and bleaching ($t_c$, $t_b$) versus the angle of incidence ($\theta$) between the normal to the substrate and the direction of the evaporation are shown in FIGS. 2-7.

Figure 6:
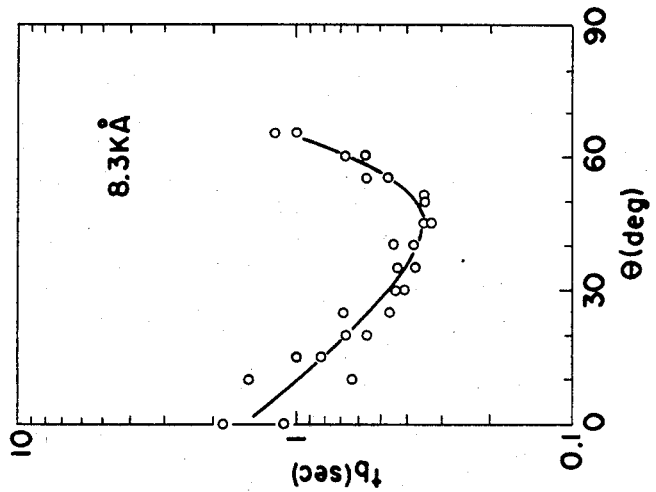
Figure 5:
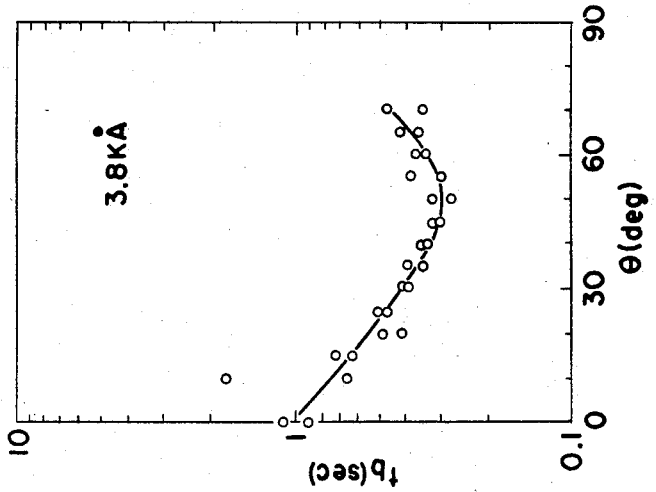

The larger the angle in incidence, the faster the coloring response time as shown in FIGS. 2-4. However this is not so with respect to the bleaching response time and according to the present invention, it has been discovered that the bleaching response time is fastest at a certain angle of incidence, as shown in FIGS. 5-7. The angle for obtaining fast responses of coloring and bleaching is preferably between 30° and 70° and more suitably between 40° and 60°.

Thus the WO$_3$ layers deposited by oblique evaporation in accordance with the present invention have fast coloring and bleaching responses. This improvement made it possible to replace the H$_2$SO$_4$ electrolyte by LiClO$_4$ and extend the cycle lifetime.

The reason why the response time is improved in accordance with the present invention will be explained by comparing the normal and oblique evaporation techniques.

First considering the conventional case of normal evaporation in which the electrochromic layers are deposted by evaporation in a direction normal to the substrate, in the beginning stage of deposition by evaporation, nuclei of evaporating material will be formed as shown in FIG. 8.

In the subsequent stages, the nuclei are elongated by the piling up of the evaporating material and thin films are formed.

Thin films deposited in this manner at normal incidence exhibit isotropic topography and nearly perpendicular to the substrate and finally the walls of the canals between the nuclei close, as shown in FIG. 9.

In the case of oblique evaporation, however, the obliquely deposited films exhibit anisotropic topography as shown in FIG. 10. This is due to the fact that the growth of obliquely deposited films is inclined or tilted relative to the beam direction of evaporation and this lateral growth causes a shadow region where no atoms can arrive directly from the beam. This selfshadowing mechanism was first proposed by K/önig and Helwig, and van de Waterbeemed and van Oosterhout formulated a theory for the growth of obliquely deposited films that includes not only the effect of geometric shadowing but also the effect of atomic mobility of the shape and the development of the columns.

As observed experimentally on silicon oxide films by L. A. Goodman et al., the growth in obliquely deposited films is in the form of rowlike columnar arrays. Therefore in an electrochromic device, the electrochromic layer with columnar structure of the present invention has a much larger surface area in contact with the electrolyte than the conventional electrochromic layer, thereby it is thought to be reasonable that because a large number of positive ions are injected into and extracted from the electrochromic layer per unit time, the color change is very fast.

When evaporated at an angle of incidence smaller than about 10°, the deposited film seems not to have the property of columnar structure. Therefore it is thought to be reasonable that the response time of the layer of electrochromic material evaporated at the angle of incidence smaller than about 10° is relatively long.

The following examples illustrating particular applications of the present invention are illustrative only and are not to be construed as a limitation of the invention.

EXAMPLE 1

A layer of electrochromic material was prepared as follows: Tungsten oxide was obliquely evaporated onto the transparent electrode, about 0.02 $\mu$m thick film of tin doped indium oxide, on the glass substrate. The angle of incidence between the normal to the substrate and the direction of the evaporation was selected in the range of from 10° to 90°. The thickness of the layer of deposited tungsten oxide was about 0.1 $\mu$m to 0.5 $\mu$m.

EXAMPLE 2

An electrochromic device was constructed from two glass plates. One glass plate was coated with a 0.02 $\mu$m thick transparent electrode film of tin doped indium oxide on which a 0.5 $\mu$m thick layer of tungsten oxide was deposited by oblique evaporation at an angle of 60°. The other glass plate was coated with a first 0.1 $\mu$m thick evaporated chromium film and a second 0.2 $\mu$m thick evaporated gold film. The glass plates so formed were pressed together with the layer of tungsten oxide and the gold film facing each other but separated by a 0.5 mm thick sealing spacer which retained an ionically conductive paste consisting of a TiO$_2$ pigment in a 1 M lithium perchlorate in propylene carbonate.

This device was cycled from color to bleach and back to color at an applied potential of 1.5 volts D.C. The response times of coloration and bleaching were about 0.2 sec and 0.5 sec respectively. The device underwent 2,000,000 cycles of switching at 20 cycles per minute without any degradation.

EXAMPLE 3

An electrochromic device was constructed from two glass plates. One glass plate was coated with a 0.02 $\mu$m thick transparent electrode film of tin doped indium oxide on which a 0.25 $\mu$m thick layer of tungsten oxide was deposited by oblique evaporation at an angle of 40°.

The other glass plate was coated with a first 0.1 $\mu$m thick evaporated chromium film and a second 0.2 $\mu$m thick evaporated gold film. The glass plates so formed were pressed together with the layer of tungsten oxide and the gold film facing each other but separated by a 0.5 mm thick sealing spacer which retained an ionically conductive paste consisting of a TiO$_2$ pigment in a 1 M lithium perchlorate in propylene carbonate. This device was cycled from color to bleach and back to color at an applied potential of 1.5 volts D.C.

The response times of coloration and bleaching were about 0.3 sec and 0.7 sec respectively. The device underwent 2,000,000 cycles of switching at 20 cycles per minute without any degradation.

Another embodiment of an electrochromic display device according to the present invention is shown in FIG. 11. The device designated by reference numeral 20 includes a transparent substrate 21, e.g., glass or plastics, and a first transparent electrode 22, e.g., tin-doped indium oxide or antimony-doped tin oxide, on the substrate 21. Electrochromic layers 23a and 23b, e.g., WO$_3$, MoO$_3$ or V$_2$O$_5$, are deposited on the first electrode 22 by an oblique evaporation technique as described above to form display electrodes which are hereinafter referred to as WO$_3$ electrodes 23a and 23b.

On the part of the transparent electrode 22 where WO$_3$ is not deposited, an insulating layer 24, e.g., Al$_2$O$_3$, is deposited. In the space between two substrates 21 and 25, a porous sheet 29 such as ceramics is arranged as a background.

An electrolyte 28, such as sulfuric acid, lithium perchlorate in propylene carbonate, lithium nitride, CaF$_2$, MgF$_2$ or Na$_{1+x}$Zr$_2$Si$_x$P$_{3-x}$O$_{12}$, is disposed in contact with a surface of the electrochromic layer 23. The electrolyte 28 is partially contained by a spacer 27. It is preferably that the spacer 27 be of a material which is inert with respect to the electrochromic environment of the device 20, e.g., a plastics. A second or counter electrode 26 is disposed in contact with the electrolyte 28 and the second electrode 26 may comprise gold film deposited on a substrate 25, e.g., glass or ceramics.

At first, a 1.5 V DC electric field was applied across the structure of the electrochromic device in FIG. 11, so that the $WO_3$ electrode 23a was negative relative to the counter electrode 26, and the charge, 5 mC/cm$^2$ was injected into the $WO_3$ electrode 23a, which turned blue with a reflectance of 42%. 100% means the fully bleached colorless state.

Next, a 1.5 V DC electric field was applied between two $WO_3$ electrodes 23a and 23b so that the electrode 23b was negative with respect to the other electrode 23a. The electrode 23b colored with a reflectance of 42%, and the electrode 23a bleached and returned to its original, colorless state, with a reflectance of 100%. Thus the charge primarily injected into the $WO_3$ electrode 23a was transferred to the other $WO_3$ electrode 23b. Then, when the polarity of the applied electric field was reversed, the two $WO_3$ electrodes 23a and 23b exchanged their colorless and colored states.

Then, when voltages were applied between the two $WO_3$ electrodes 23a and 23b alternating in polarity as shown in FIG. 12, the two $WO_3$ electrodes 23a and 23b colored alternately with the same optical or coloration density.

The structure of a second electrochromic device shown in FIG. 13 is identical with that of FIG. 11, although the pattern of the layer of electrochromic material is arranged such that the $WO_3$ electrodes are arranged as display segments for a numerical display. Eight display segments 31 to 38 inclusive are used to display numerals but three auxiliary segments 39 to 41 inclusive are used auxiliary and may be hidden by a cover plate or the like so as to be concealed.

The area of each segment 31 to 37 inclusive and the segment 39 is S, that of the segments 38 and 40 is 2S respectively, and that of 41 the segment is 3S, where S is 1 mm$^2$.

At first, a 1.5 V DC electric field was applied between the eight segments, 31 to 37 and 39, and the counter electrode, so that the eight segments were negative with respect to the counter electrode. These eight segments turned blue with a reflectance of 42% by the injected charge 5 mC/cm$^2$. But the three segments, 38, 40 and 41 were colorless with no charge. As shown in FIG. 13, the seven colored display segments 31 to 37 displayed the figure "8".

Next, a 1.5 V DC electric field was applied between the segments 35, 39 and the segment 40. The electric charge which had been held in the segment 35 and 39 was transferred to the segment 40 and as the total area of the segments 35 and 39 is 2S, which is equal to the area of the segment 40, the reflectance of the colored segment 40 was also 42%. Therefore, the display showed the figure "9" uniformly colored.

By repeating the application of an electric field in the same way, the electric charge in the segments 37 and 40 was transferred to the segments 35 and 38 and the figure changed to "10".

As described above, by applying a DC voltage between the $WO_3$ electrodes, the electric charge initially held in the group of colored electrodes is transferred to the group of primarily colorless or bleached electrodes and the display changes. In this driving method, designated the charge transfer drive method driving the circuit is relatively simple and the coloring and bleaching responses hardly depend on the number or the area of the display segments even in a practical numerical display, and moreover even if the response time varies depending on the ambient temperature, the optical density of the colored segments does not vary and remains constant. In FIG. 11 or 13, it is possible to drive the electrochromic device 20 by the charge transfer drive method without using the counter electrode 26. This can be accomplished by applying a DC electric field between the colored and bleached segments of the first electrode 22 so that electric charge is transferred through the electrolyte between the colored and bleached segments.

I claim:

1. In an electrochromic device of the type having a substrate, an electrode disposed on the substrate, a layer of electrochromic material disposed in a predetermined pattern on the electrode and an electrolyte disposed on the layer of electrochromic material, the improvement comprising: said layer of electrochromic material having anisotropic topography formed by depositing by evaporation said electrochromic material such that the direction of evaporation makes an acute angle in the range of from 30° to 70° with respect to the normal to said substrate.

2. An electrochromic device according to claim 1; wherein said layer of electrochromic material having anisotropic topography comprises a film deposited by the evaporation of electrochromic material with the angle of incidence between the normal to the substrate and the direction of the evaporation in the range of from 40° to 6°.

3. An electrochromic device according to claim 1; in which said electrolyte comprises an acid.

4. An electrochromic device according to claim 3; in which said acid comprises sulfuric acid.

5. An electrochromic device according to claim 1; in which said electrolyte comprises a salt.

6. An electrochromic device according to claim 5; in which said salt comprises lithium perchlorate.

7. An electrochromic device according to claim 1; in which said electrolyte comprises an ionic conductive compound.

8. An electrochromic device according to claim 7; in which said ionic conductive compound comprises lithium nitride.

9. An electrochromic device according to claim 1; wherein said layer of electrochromic material comprises tungsten oxide.

10. An electrochromic device according to claim 1; wherein the thickness of said layer of electrochromic material is in the range of from about 0.1 μm to 0.5 μm.

11. An electrochromic device according to claim 1, or 2 wherein said layer of electrochromic material having anisotropic topography comprises rowlike columnar arrays of electrochromic material which make an acute angle with respect to the normal to said substrate.

12. In an electrochromic device of the type having a substrate, an electrode disposed on the substrate, a layer of electrochromic material disposed in a predetermined pattern on the electrode and operable to undergo cycles of coloration and bleaching during use of the electrochromic device, and an electrolyte disposed on the layer of electrochromic material, the improvement comprising: said layer of electrochromic material having an anisotropic topography formed by the deposition by evaporation of electrochromic material at a direction of evaporation which makes an acute angle in the range of from 30° to 70° with respect to the normal to said substrate to effectively speed up the response time of coloration and bleaching as compared to electrochromic material of the same composition having isotropic topography.

13. An electrochromic device according to claim 12; wherein said layer of electrochromic material having anisotropic topography comprises rowlike columnar arrays of electrochromic material which make an acute angle with respect to the normal to said substrate.

14. An electrochromic device according to claim 12; wherein the predetermined pattern of the layer of electrochromic material comprises a plurality of display segments each capable of exhibiting colored and bleached states; and means for applying a DC electric field between preselected ones of the colored and bleached display segments to effect the transfer of electric charges for coloration through the electrolyte from the colored to the bleached display segments.

15. In an electrochromic display device of the type having a substrate, an electrode disposed on the substrate, layers of electrochromic material forming plural segments and disposed on the electrode, and an electrolyte disposed on the layers of electrochromic material, the improvement comprising: said layers of electrochromic material having anisotropic topography formed by depositing by evaporation said electrochromic material such that the direction of evaporation makes an acute angle in the range of from 30° to 70° with respect to the normal to said substrate, and means for applying a DC electric field between preselected ones of the electrochromic layers on the electrode to effect the transfer of electric charges through the electrolyte between the selected electrochromic layers.

16. An electrochromic display device according to claim 15; wherein the layers of electrochromic material are formed by depositing by evaporation said electrochromic material such that the direction of evaporation makes an acute angle in the range of from 40° to 60° with respect to the normal to said substrate.

* * * * *